(12) United States Patent
See et al.

(10) Patent No.: US 6,189,070 B1
(45) Date of Patent: Feb. 13, 2001

(54) APPARATUS AND METHOD FOR SUSPENDING OPERATION TO READ CODE IN A NONVOLATILE WRITABLE SEMICONDUCTOR MEMORY

(75) Inventors: Deborah L. See, Placerville; Robert N. Hasbun, Shingle Springs, both of CA (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/919,539

(22) Filed: Aug. 28, 1997

(51) Int. Cl.$^7$ .................................................... G06F 13/00
(52) U.S. Cl. .......................... 711/103; 711/100; 365/218; 365/900; 710/48; 710/260
(58) Field of Search .................................. 711/100, 103, 711/269; 365/218, 900; 710/260, 47, 48

(56) References Cited

U.S. PATENT DOCUMENTS

| | | | |
|---|---|---|---|
| 4,965,828 | 10/1990 | Ergott et al. | 380/50 |
| 5,021,996 | 6/1991 | Watanabe | 364/900 |
| 5,255,314 | 10/1993 | Applegate et al. | 379/212 |
| 5,287,469 | * 2/1994 | Tsuboi | 711/103 |
| 5,351,216 | 9/1994 | Salt et al. | 365/230.01 |
| 5,355,464 | 10/1994 | Fandrich et al. | . |
| 5,369,754 | 11/1994 | Fandrich et al. | 395/425 |
| 5,377,145 | 12/1994 | Kynett et al. | 365/189.05 |
| 5,414,829 | 5/1995 | Fandrich et al. | 395/425 |
| 5,418,752 | 5/1995 | Harari et al. | 365/218 |
| 5,422,843 | 6/1995 | Yamada | 365/185 |
| 5,424,992 | 6/1995 | Coffman et al. | 365/218 |
| 5,424,993 | 6/1995 | Lee et al. | 365/218 |
| 5,521,864 | 5/1996 | Kobayashi et al. | 365/185.22 |
| 5,568,644 | 10/1996 | Nelson et al. | 395/741 |
| 5,590,073 | 12/1996 | Arakawa | 365/185.08 |
| 5,687,121 | 11/1997 | Lee et al. | 365/185.11 |
| 5,742,787 | 4/1998 | Talreja | 395/430 |
| 5,805,929 | * 9/1998 | Connolly et al. | 395/869 |

* cited by examiner

Primary Examiner—Tuan V. Thai
(74) Attorney, Agent, or Firm—Blakely, Sokoloff, Taylor & Zafman LLP

(57) ABSTRACT

A method and apparatus manages data and reads code from a nonvolatile writeable memory. In a nonvolatile writeable system, interrupts are disabled. A non-read operation is initiated in the nonvolatile writeable memory. A check for whether an interrupt has occurred is performed. If an interrupt has occurred, then the non-read operation in the nonvolatile writeable memory is suspended. Interrupts are enabled, and code is read from the nonvolatile writeable memory. Non-read operations may include program operations and erase operations.

13 Claims, 8 Drawing Sheets

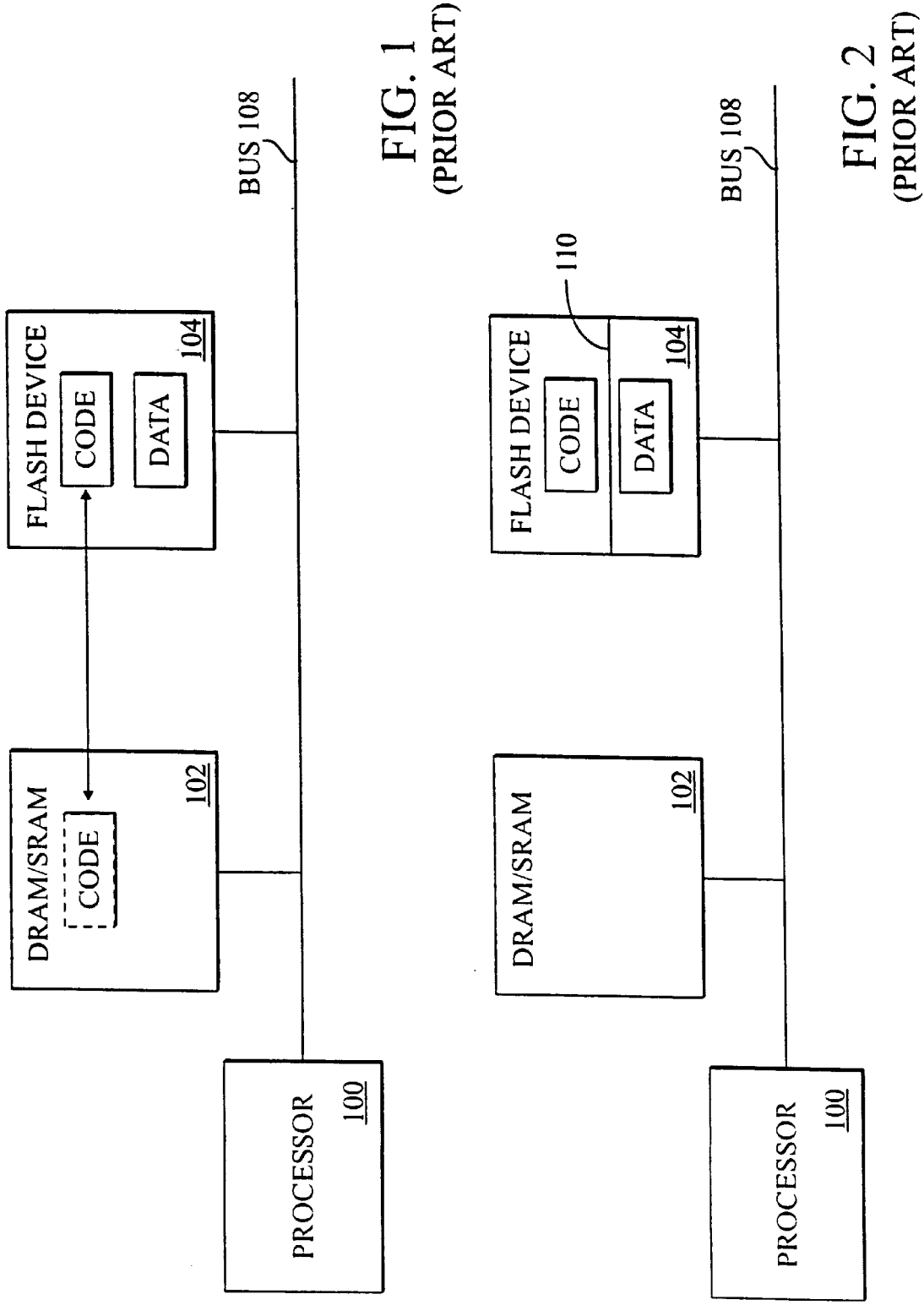

APPARATUS AND METHOD FOR SUSPENDING OPERATION TO READ CODE IN A NONVOLATILE WRITABLE SEMICONDUCTOR MEMORY

CROSS REFERENCE TO RELATED APPLICATIONS

The present application is related to U.S. patent applications for a: "METHOD AND APPARATUS FOR PREEMPTING OPERATIONS IN A NONVOLATILE WRITEABLE MEMORY IN ORDER TO READ CODE FROM THE NONVOLATILE WRITEABLE MEMORY," of Charles W. Brown, et al., application Ser. No. 08/717,268, filed on Sep. 20,1996, assigned to the assignee of this application; "NONVOLATILE WRITEABLE MEMORY WITH PROGRAM SUSPEND COMMAND," of David A. Leak, et al., application Ser. No. 08/718,216, filed on Sep. 20, 1996, assigned to the assignee of this application; "NONVOLATILE WRITEABLE MEMORY WITH PROGRAM SUSPEND COMMAND," of David A. Leak, et al., application Ser. No. 08/807,385, filed on Sep. 20, 1996, assigned to the assignee of this application; and "NONVOLATILE WRITEABLE MEMORY WITH PREEMPTION PIN," of Charles W. Brown, et al., application Ser. No. 08/717,214, filed on Aug. 28, 1997, assigned to the assignee of this application.

FIELD OF THE INVENTION

The present invention relates to the field of memory devices. More particularly, this invention relates to suspending an operation in a nonvolatile writeable memory in order to perform other operations in the nonvolatile writeable memory.

BACKGROUND OF THE INVENTION

One type of prior art nonvolatile writeable memory is a flash device. A typical flash device has the same array configuration as a standard Electrically Programmable Read-Only Memory ("EPROM") and can be programmed in a similar fashion as an EPROM. Once programmed, either the entire contents of the flash device or a block of the flash device can be erased by electrical erasure in one relatively rapid operation. An erasing voltage is made available to the sources of all the cells in the flash device or in one block of the flash device. This results in a full array erasure or a block erasure. The flash device or the erased block of the flash device may then be reprogrammed with new data.

Flash devices may be read, programmed (or written), and erased. For a prior art flash device, a program operation to write a byte of data typically takes on the order of 10 microseconds. Because, however, there is some margin required for guaranteeing that the program operation has properly completed, a maximum program time is specified by the flash device manufacturer. Thus, while the typical program operation may take 10 microseconds, the system may need to wait a maximum program operation time of 100 microseconds in order to guarantee that the program operation performed correctly.

Similarly, for a prior art flash device, an erase operation may take from 300–600 milliseconds in order to erase a 8 kilobyte block of data. However, the flash device may require up to a maximum erase operation time of 3 seconds in order to guarantee that the erase operation of the entire block of data has performed correctly.

Because the erase operation has such a long latency time, a prior art flash device includes an erase suspend command. When an erase suspend command is written to the flash device, the flash device suspends the erase operation that is being performed. Other operations may then be performed on the flash device. Subsequently, when an erase resume command is written to the flash device, the flash device resumes the erase operation from where it was suspended. An implementation of the erase suspend circuitry is described in U.S. Pat. No. 5,355,464, entitled "Circuitry And Method For Suspending The Automated Erasure Of A Non-Volatile Semiconductor Memory," by Fandrich et al., and issued to the common assignee of this application.

FIG. 1 shows a prior art representation of a system comprising a processor 100, a volatile memory 102, and a flash device 104 coupled together via a bus 108. The volatile memory 102 and the flash device 104, however, could be coupled to the processor 100, via separate buses. The flash device includes a memory array for storing both code and data, wherein the code is executable by the processor.

A problem occurs in this configuration when an interrupt causes the processor 100 to autovector, i.e., automatically vector execution in response to the interrupt, to an interrupt handler located within the flash device or normal code execution attempts to execute from the flash. A typical flash device has at least two modes—a read mode and a status mode in addition to other modes. In one prior art flash device, the flash device transitions into status mode automatically when a program or an erase operation is performed. The flash device remains in status mode until the flash device finishes its non-read operation. If a read is performed during this time, status of the flash device is returned indicating whether the non-read operation has completed. In order to subsequently read data (or code) from the flash device, the flash device is changed back to its read mode by writing to a register within the flash device. Thus, if an interrupt causes the processor to read from the flash device while the flash device is still in status mode, the processor will not read the code that it is expecting—it will instead read status. (In the following discussion, "code" is used to denote bits which are executable by a processor, and "data" is used to denote bits which are not executable by a processor.)

One solution is to shadow, or copy, the code from the flash device to the volatile memory, which is typically either dynamic random access memory (DRAM) or static random access memory (SRAM). After the code is shadowed in the volatile memory, if the flash device is performing a program operation and the processor generates a code fetch request due to an interrupt, for example, then the processor can satisfy the code fetch request by reading the requested code from the volatile memory 102. The processor does not need to wait for the flash device 104 to finish its program operation in order to perform the code fetch.

This scheme, however, may be expensive if the size of the code stored in the flash device is large, since the DRAM/SRAM would need to be large enough to store the entire code block in order to overcome the program operation latency. This scheme also requires the microprocessor to have a capability to "re-vector" its interrupts to RAM. Most microprocessors do not have this capability.

FIG. 2 shows an example of a prior art system which utilizes a fixed hardware partition 110 within the flash device 104 to separate the code from the data. Extra circuitry is added to the flash device to allow only a data section to enter status mode while a code section remains in read mode. Atypical approach is to partition the memory on a block boundary and then duplicate memory array row and column decoders, and charge pump circuits. The duplicate circuitry is needed to segment the standard memory array into separate physical partitions which can be sensed separately. Thus, when the data partition status is busy (e.g., array cells are being programmed or erased), the code partition has row/column decode circuitry available for reading.

However, the extra circuitry is expensive and increases the die size of the flash device. Additionally, the fixed sizes of the data section and the code section created by the hardware partition 110 restrict the flexibility of usage of the flash device.

SUMMARY OF THE PRESENT INVENTION

A method and apparatus for managing data and reading of code from a nonvolatile writeable memory is described. The nonvolatile writeable memory stores both code and data. In a nonvolatile writeable system, interrupts are disabled. A non-read operation is initiated in the nonvolatile writeable memory. A check for whether an interrupt has occurred is performed. If an interrupt has occurred, then the non-read operation in the nonvolatile writeable memory is suspended. Interrupts are enabled, and code is read from the nonvolatile writeable memory. Non-read operations may include program operations and erase operations.

Other features, and advantages of the present invention will be apparent from the accompanying drawings and from the detailed description that follows below.

BRIEF DESCRIPTION OF THE DRAWINGS

FIG. 1 shows a prior art representation of a system comprising a flash device, a processor and a volatile memory coupled together via a bus.

FIG. 2 shows a prior art system that uses a flash device with a hardware partition to store both code and data.

FIG. 3b shows the contents of the SRAM/DRAM of FIG. 3a.

FIG. 3c shows the contents of the flash device of FIG. 3a.

DETAILED DESCRIPTION

A method and apparatus for suspending a non-read operation in a nonvolatile writeable memory in order to read code from the nonvolatile writeable memory is described. Although the detailed description describes embodiments using a flash device, the invention may be used with any nonvolatile writeable memory, including, but not limited to EEPROMs, and flash memories, including technologies such as NOR, NAND, AND, DIvided bit-line NOR (DINOR), and Ferro-electric Random Access Memory (FRAM).

Figure 3A:
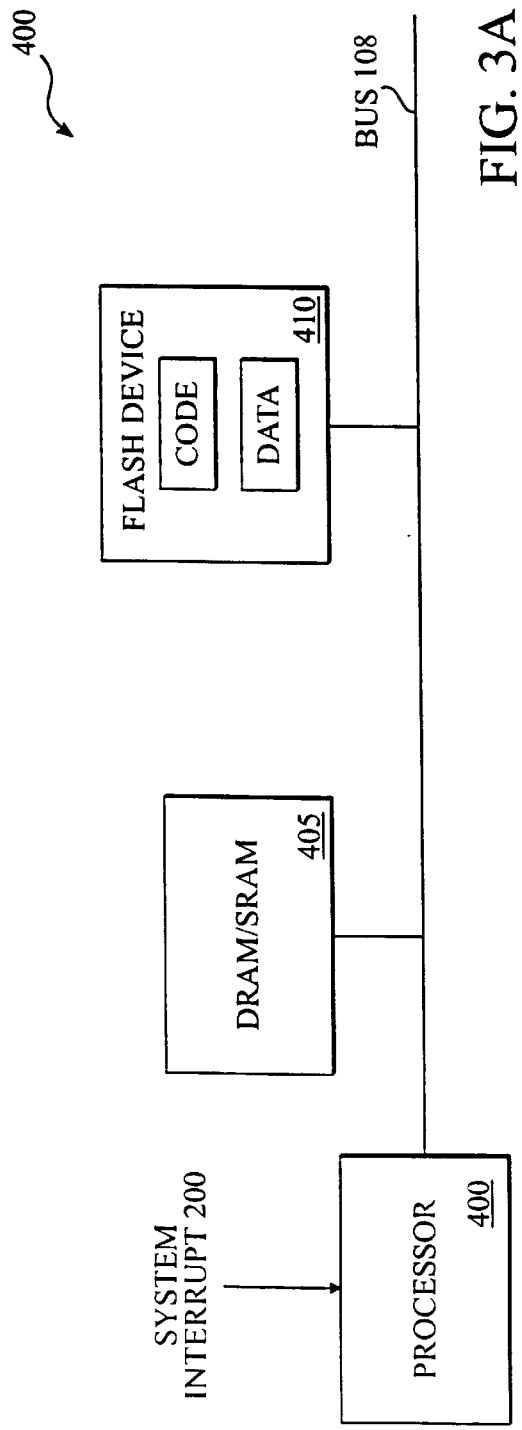
FIG. 3a is a block diagram showing a system including a processor, SRAM/DRAM, and flash device coupled together via a bus.
Figure 3B:
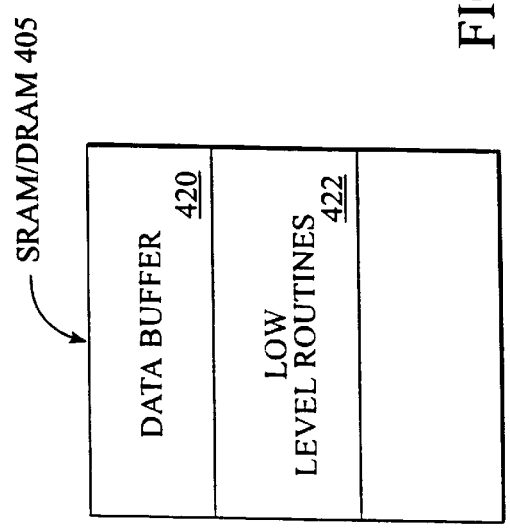
Figure 3C:
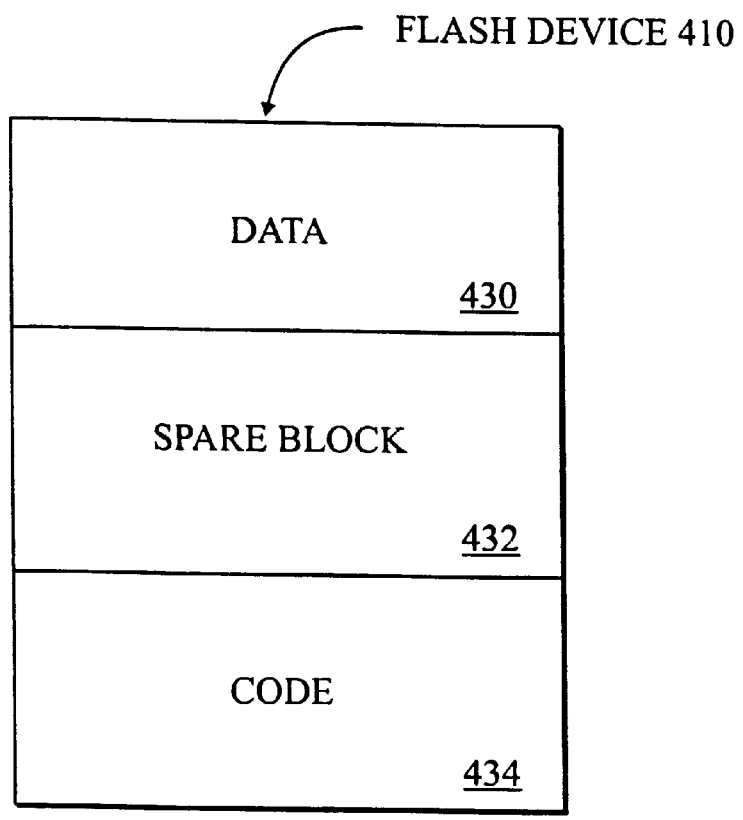

FIG. 3a is a block diagram showing a system 400 including a processor 402, SRAM/DRAM 405, and flash device 410 coupled together via a bus 108. A system interrupt 200 is coupled to provide an input to the processor 402. For another embodiment, the SRAM/DRAM 405 and the flash device 410 are coupled to the processor 402 via different buses. FIG. 3b shows the contents of the SRAM/DRAM 405 of FIG. 3a, and FIG. 3c shows the contents of the flash device 410 of FIG. 3a. The flash device 410 does not include a code-data hardware partition or duplicate array decode circuitry for allowing the flash device to perform a read while it is performing a program or an erase operation to its memory array, as was discussed with respect to FIG. 2.

In one embodiment, the SRAM/DRAM 405 includes a data buffer storage area 420. This data buffer storage area is used for temporarily storing data prior to storing it in a data area 430 of the flash device 410. The temporary buffer allows the data to be written relatively quickly to the SRAM/DRAM 405, and then transferred to the flash device 410 when there is time to do so.

In one embodiment, the SRAM/DRAM 405 also includes low level routines 422. The low level routines 422 are used for non-read operations to the flash device, such as programming or erasing the flash device. The low level routines may be downloaded from the flash device to the SRAM/DRAM 405 upon initialization of the system 400. In another embodiment, the low level routines may be stored in a computer-readable medium such as a floppy disk, hard disk, or tape, and the low level routines are downloaded to the system 400. Alternatively the low level routines maybe transferred to the system via a network such as a LAN or a World Wide Web connection, as is well known.

The flash device 410 includes a data area 430 and a code area 434. A spare block area 432 may be used for block management. The code area is used to store various routines which are executable by the processor 402.

As one example, system 400 could be used in a personal computer system. The flash device 410 may include BIOS information for booting up the computer system. The flash device may also include an operating system for scheduling tasks, as is well known. The operating system may alternatively reside in a memory system (not shown) connected to the bus 108. System 400 may alternatively be employed in a number of other electronic devices.

A problem occurs when an interrupt 200 is received by the processor 402 while a non-read operation, such as a program operation or an erase operation, is being performed in the flash device 410. If the processor services the interrupt by fetching code from the flash device 410, invalid code would be read, because the flash device 410 would return status information, instead of code. Unpredictable processor behavior may result, if the processor tried to execute the invalid code.

One example of this problem occurring is if system 400 is employed within a cellular phone. A system interrupt 200 may arise from an incoming call. If data is being stored to the flash device (e.g., storing a phone number), when an incoming call comes in, a problem will occur if the processor vectors to the flash device 410 to fetch code from the flash device in order to execute an interrupt service routine located within the flash device.

Although a hardware partition could be implemented to solve this problem, there is additional cost for the required decoding circuitry. Additionally, a hardware partition creates sections of the flash device which are fixed in size. This limits the flexibility of use of the flash device, because future uses of the flash device may have different code requirements versus data requirements.

The present invention, instead, uses a method of preventing the processor from automatically vectoring to the flash memory in response to a system interrupt 200. This solution disables interrupts when a non-read operation (e.g., a program operation or an erase operation) is performed on the flash device 410. Interrupts are then checked, e.g., by polling. If an interrupt is found, then the non-read operation is suspended in the flash device. Interrupts are enabled so that the processor can vector to the flash memory in order to executed code located in the flash memory.

Figure 4A:
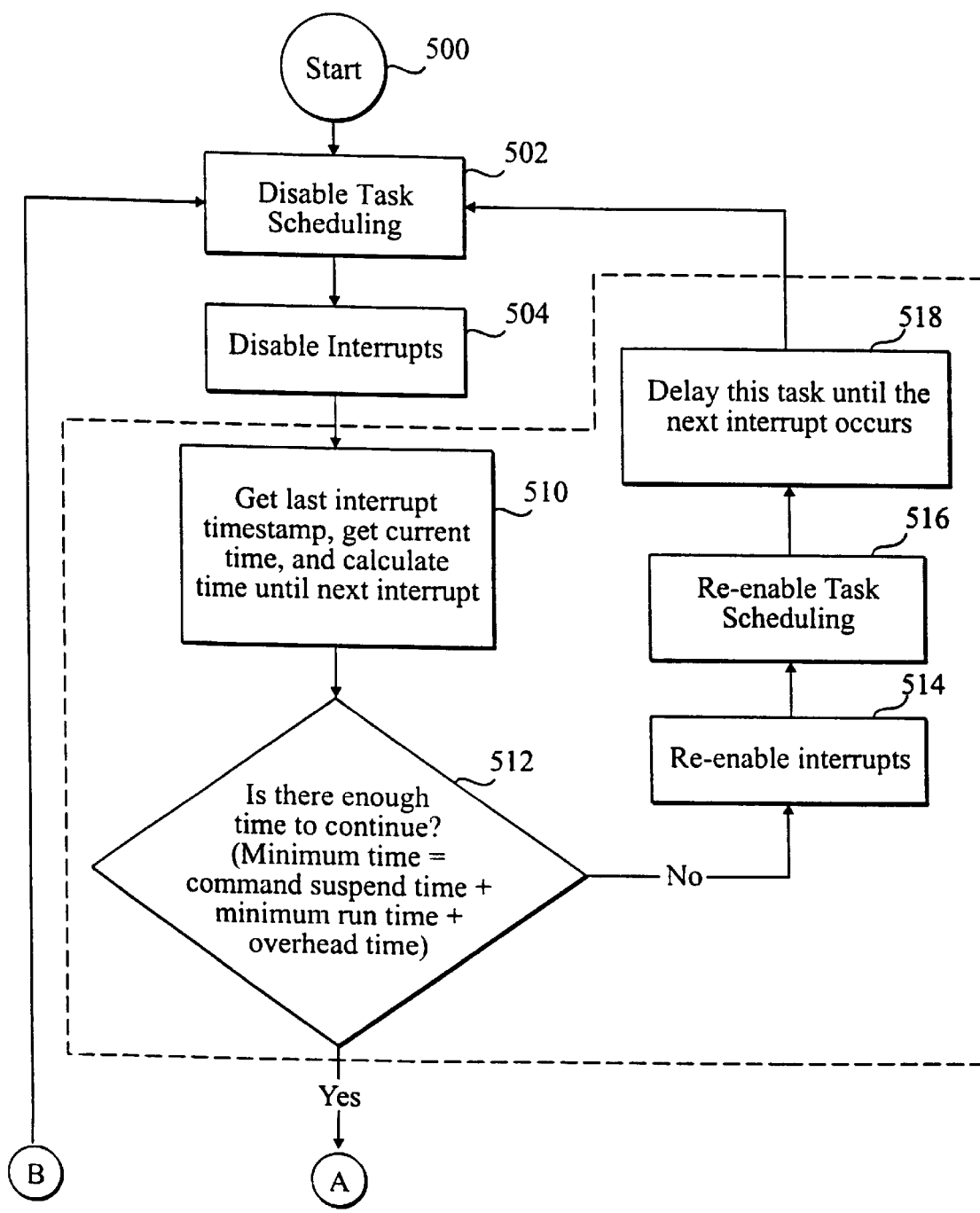
FIGS. 4a and 4b are a flowchart showing exemplary steps taken by a system having the configuration shown in FIGS. 3a, 3b, and 3c.
Figure 4B:
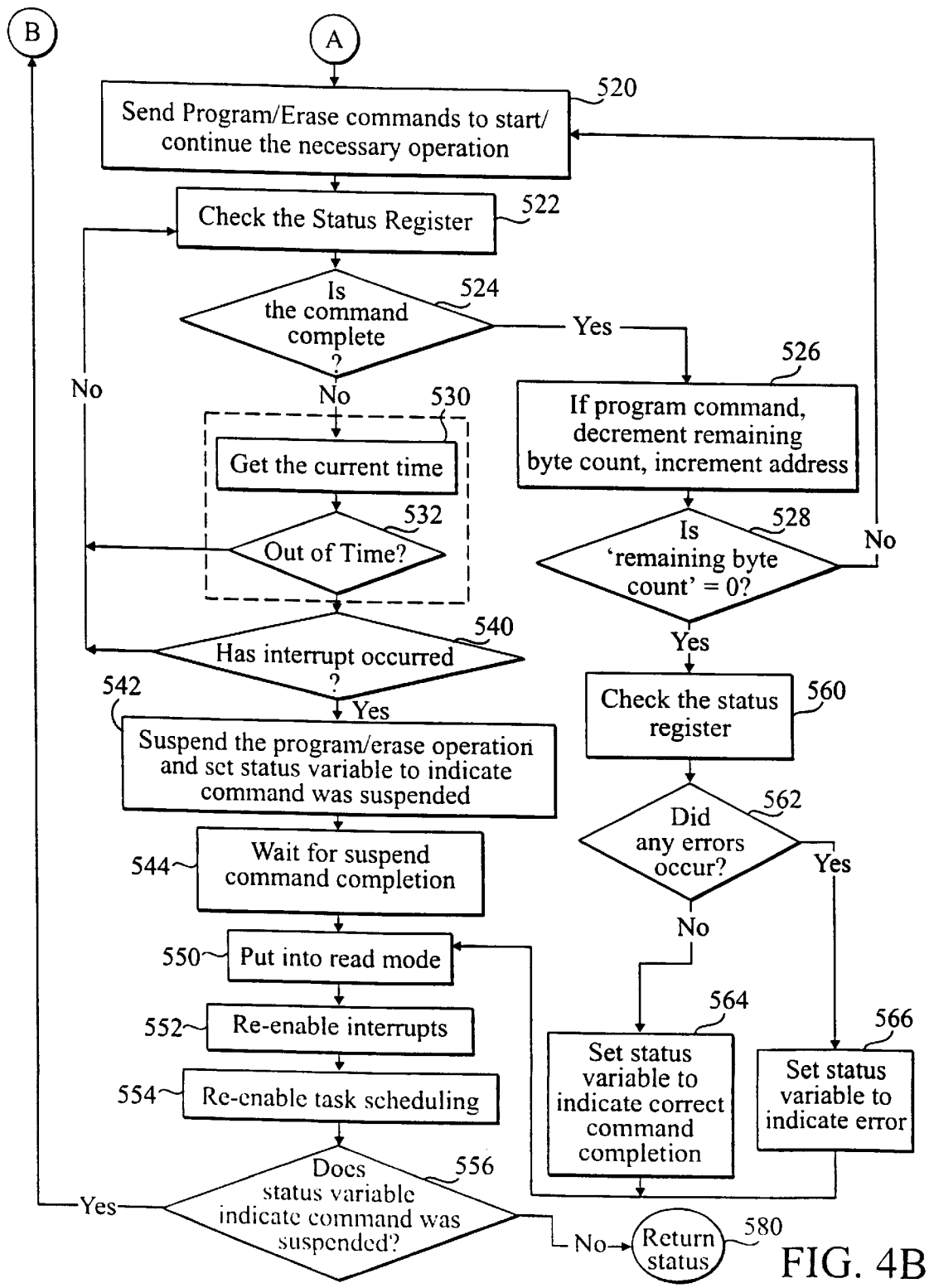

FIGS. 4a and 4b are a flowchart of the present invention showing exemplary steps taken by a system 400 having the configuration shown in FIGS. 3a, 3b, and 3c in performing non-read operations stored in the volatile memory 405. The flow chart starts at block 500. The operation continues at block 502, at which task scheduling is disabled. The operation continues at block 504, at which interrupts are disabled. In one embodiment, the disabling of task scheduling and interrupts is performed by setting a flag or register within the processor 402. From block 504 operation continues at block 510.

Blocks 510 through 518 are optional. They may be used to reduce interrupt latency. In one embodiment, they are used when an interrupt occurs predictably and periodically within a system that has a system clock for measuring time. At block 510, the last interrupt time stamp and the current interrupt time stamp are obtained, and the time until the next interrupt is calculated. At block 512, a determination is made whether there is enough time to proceed with the operation before the next interrupt occurs. In one embodiment, the minimum amount of time required is the amount of time to suspend the operation added to the minimum amount of time to run the operation plus overhead time. If there is not enough time to perform the operation before the next interrupt, then operation moves to blocks 514, 516 and 518, at which interrupts are re-enabled, task scheduling is re-enabled, and this task is delayed until the next interrupt occurs.

However, if at block 512 (or optional block 510 through 518 are omitted), there is enough time to perform at least a portion of the operation, then the flow chart proceeds at block 520. At block 520 programming or erasing of the nonvolatile writeable memory is initiated. Operation continues at block 522, at which a status register is checked. At block 524 a determination is made whether the program or erase command is completed.

If the command is completed, then operation continues at block 526, at which the byte count is decremented and the address is incremented. At block 528 a determination is made whether there are any remaining bytes. If there are remaining bytes (that is, if the remaining byte count does not equal zero), then operation continues at block 520. However, if at block 524 the command is not complete, then operation continues at optional block 530, at which the current time stamp is retrieved.

Blocks 530 and 532 are optional and are used with the embodiment including blocks 510 through 518. At block 532 a determination is made whether there is enough time to complete the program or erase operation before the next predictable interrupt. If there is enough time, then operation proceeds from block 532 to block 522. If there is not enough time then operation transfers from block 532 to block 540. If optional blocks 530 and 532 are not used, then operation flows from block 524 directly to block 540.

At block 540 a determination is made whether an interrupt to the processor has occurred. In one embodiment, when an interrupt to the processor occurs, a register within the processor is set. The software is able to poll the register in the processor to determine whether an interrupt has occurred. If an interrupt has not occurred, then operation proceeds from block 540 back to block 522. However, if an interrupt has occurred, then operation proceeds from block 540 to block 542.

At block 542 the program or erase operation being executed in the non-volatile writeable memory is suspended. Additionally, a status variable is set indicating that the command was suspended. At block 544, a wait state is entered while the suspend command completes.

From block 544 operation continues at block 550, at which the non-volatile writeable memory is put into read mode. In one embodiment, the non-volatile writeable memory is put into read mode by writing into a register of the non-volatile writeable memory.

Returning to block 528, if there were no remaining byte counts (that is, if the remaining byte count equals zero), then the status register is checked at block 560. At block 562, if no error has occurred, then operation continues at block 564 at which the status variable is set to indicate correct completion. Operation then proceeds to block 550. However, if at block 562, errors did occur, then operation continues at block 566, at which a status variable is set to indicate that an error occurred. From block 566 operation continues at block 550.

From block 550 operation continues at blocks 552 and 554, at which interrupts and task scheduling are re-enabled. It is at this point that the processor will attempt to handle its pending interrupt by retrieving code from the interrupt handler located within the non-volatile writeable memory. However, interrupts can be checked at any point/many points in the polling loop to reduce latency). At block 556, a determination is made whether a non-read operation was suspended. If a non-read operation was suspended, then operation returns to block 502, to attempt to complete the original program or erase operation. However, if a non-read operation was not suspended, then operation continues at block 580, at which the flow chart terminates.

Although interrupts were polled only at block 140 in the description above, in an alternate embodiment, interrupts may be checked at any point in the polling loop to reduce latency.

Flash Device Hardware

Figure 5:
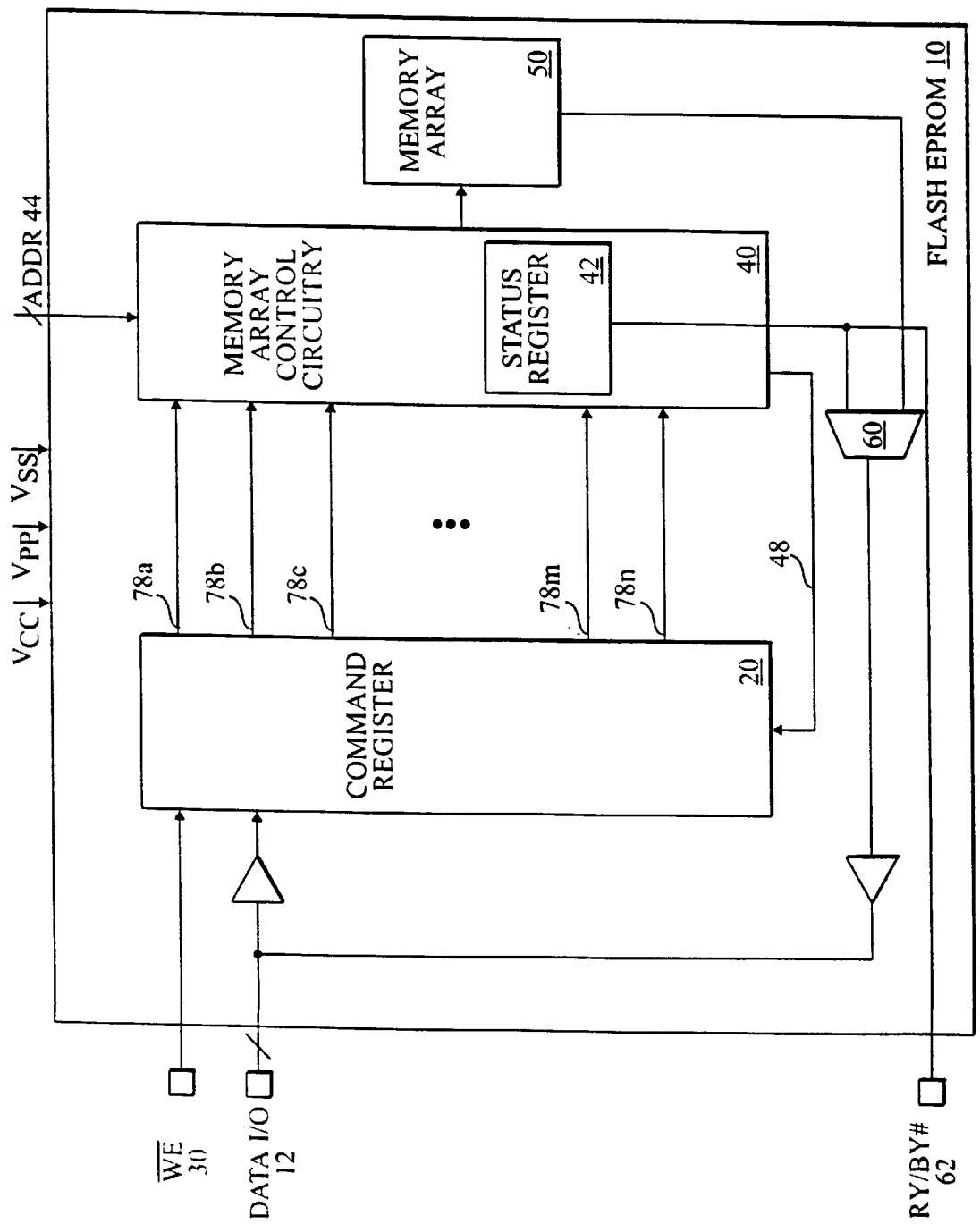
FIG. 5 shows a prior art representation of a flash device.
Figure 6:
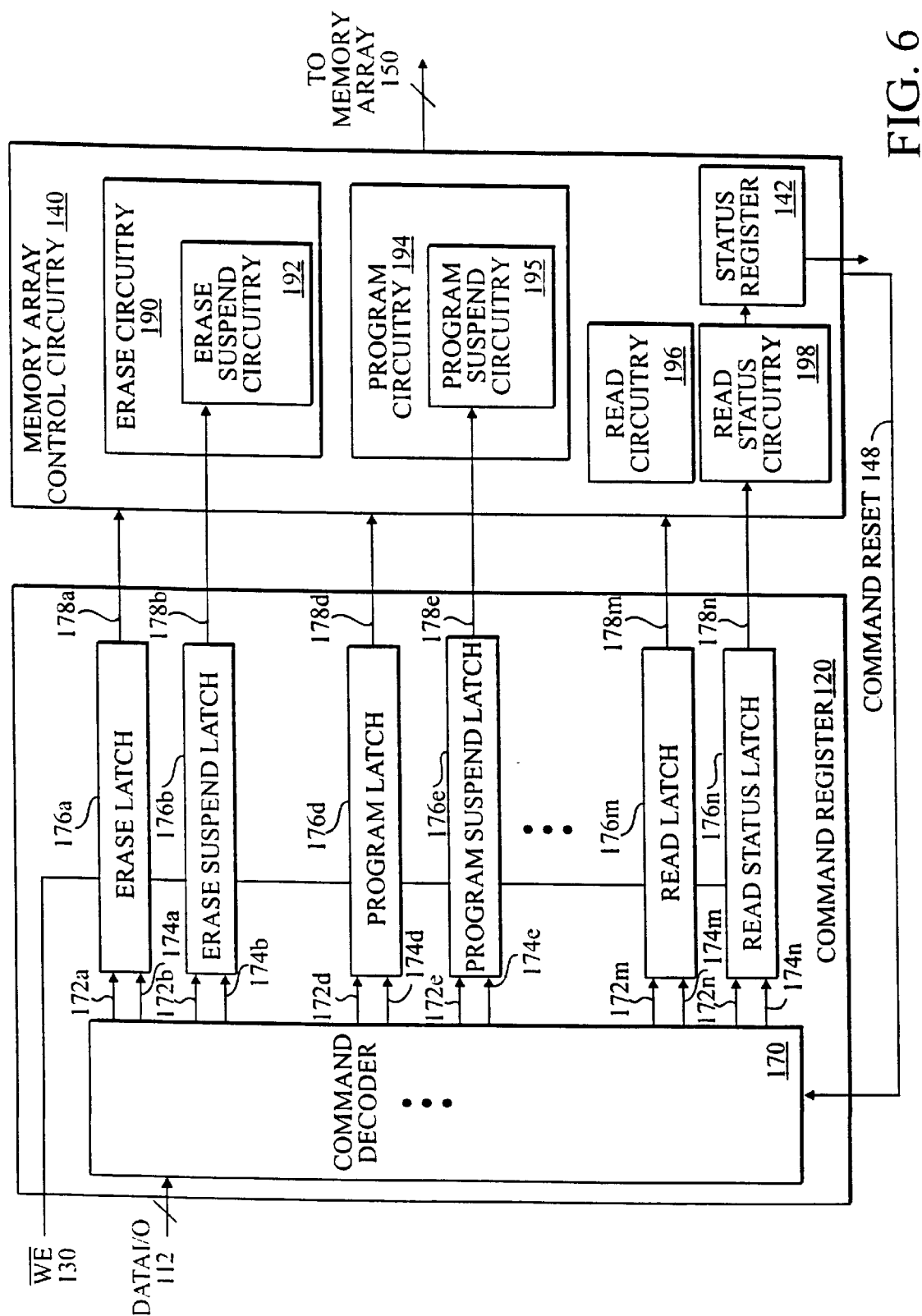
FIG. 6 shows a block diagram of the command register and the memory array control circuitry in accordance with one embodiment of the invention.
Figure 7:
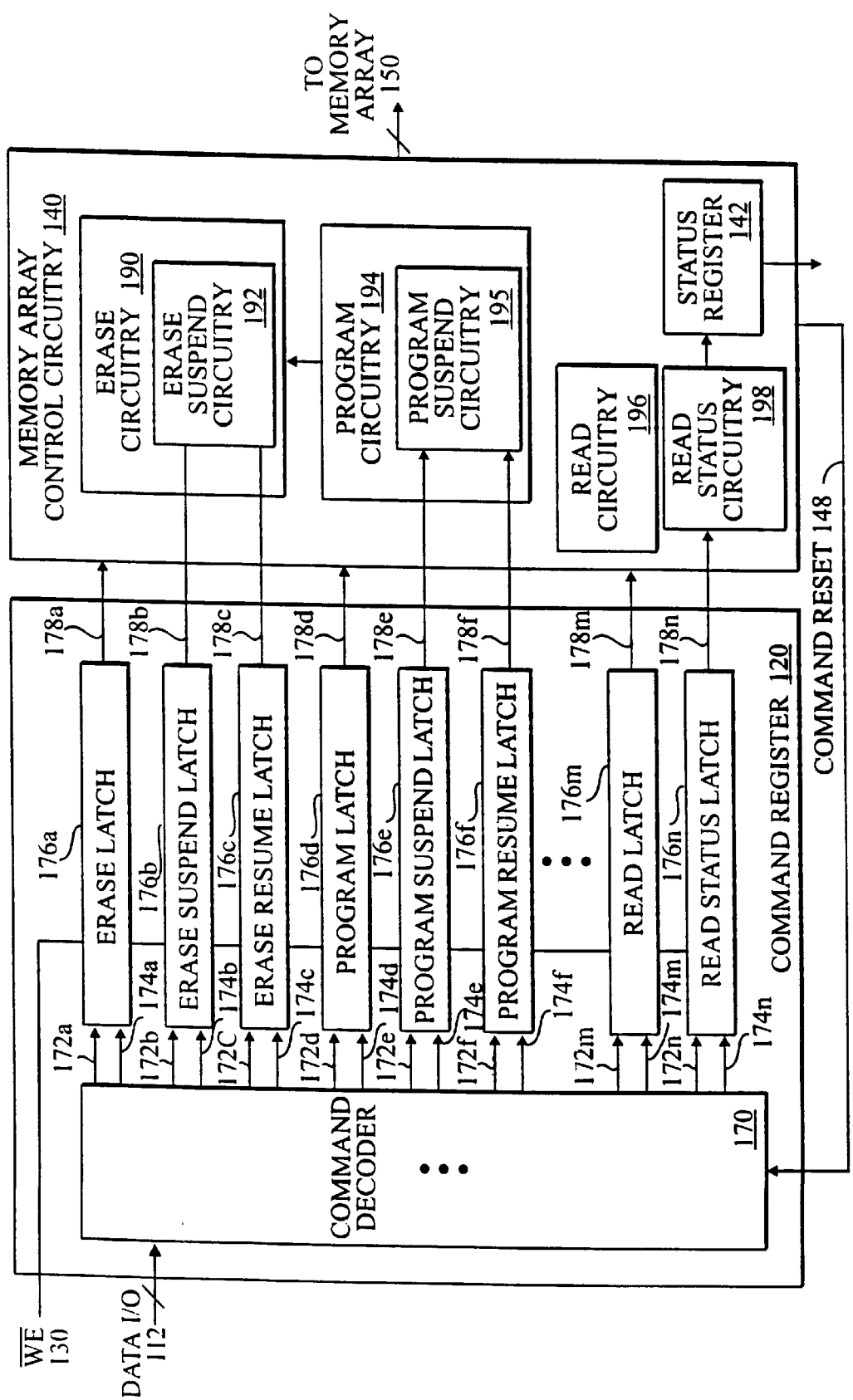
FIG. 7 shows a block diagram of another embodiment of the command register and the memory array control circuitry.

FIGS. 5–7 describe the underlying hardware used to suspend the flash device, as described in the flowchart of FIGS. 4a and 4b. FIG. 5 shows a high level representation of a prior art flash device 10. The flash device includes a command register 20, memory array control circuitry 40, and memory array 50.

A number of data input/output (I/O) pins 12 are coupled from pins of the flash device to a command register 20. The number of data I/O pins 12 is usually 8 pins or 16 pins, which matches the size of data to be stored to the flash device. The data I/O pins 12 allow commands to be written to the command register 20. For example, for one prior art flash device, the command decoder includes circuitry for decoding the following commands: (1) erase, (2) erase suspend, (3) erase resume, (4) program, (5) read, and (6) read status. A write enable (WE#) pin 30 is coupled to provide an input to the command register 20.

The command register 20 is coupled to memory array control circuitry 40 via signal lines 78a–n. The memory array control circuitry 40 includes a status register 42. The memory array control circuitry 40 also includes read circuitry, row and column decoder circuitry for accessing and providing data to cells in the memory array 50, and a write state machine, which includes program and erase circuitry. The memory array control circuitry 40 provides the appropriate signals to access the memory array 50 for carrying out the commands provided by the command register 20. The memory array control circuitry 40 receives an address input from address pins 44 of the flash device. A command reset signal 48 is coupled from the memory array control circuitry 40 to the command register 20.

The memory array 50 is coupled to provide data to an output multiplexer 60 for providing data to the data I/O pins 12 of the flash device responsive to a read operation. The status register 42 is also coupled to provide data to the output multiplexer 60, which provides status data to the data I/O pins 12 of the flash device responsive to a read status operation. The status register 42 provides information about the current operation being executed by the flash device. The memory array control circuitry 40 controls the output multiplexer 60 based upon the commands provided to it from the command register 20. The memory array control circuitry 40 selects the status register output to pass through the output multiplexer 60 in response to a read status operation. In one prior art flash device, the memory array control circuitry 40 also selects the status register output to pass through the output multiplexer 60 during program and erase operations. The memory array control circuitry selects which memory array output to pass through the output multiplexer 60 in response to a read operation.

In a prior art flash device, a Ready/Busy (RY/BY#) pin 62 of the flash device provides a status indicator of whether the flash device is busy or not. The RY/BY# pin is "low" to indicate a busy state, which signifies that the flash device is performing a block erase operation or a byte write operation. The RY/BY# pin is "high" to indicate a ready state, which signifies that the flash device is ready for new commands, block erase is suspended, or the device is in a powerdown mode. The status register 42 is coupled to provide an output to the RY/BY# pin 62. Additionally, the status may be provided automatically during read operations while the flash device remains in status mode, as was previously described.

A supply voltage Vcc, ground potential Vss, and a programming voltage Vpp are provided to the flash device 10.

FIG. 6 shows a block diagram of the command register 120 and the memory array control circuitry 140 in accordance with one embodiment of the flash device 410 of the current invention.

A command decoder 170 decodes the following commands: (1) erase, (2) erase suspend, (3) erase resume, (4) program, (5) program suspend, (6) program resume, (7) read, and (8) read status. The command decoder provides the decoded command to a corresponding command latch 176*a–n* via signal lines 172*a–n*. The command latches are latched using the write enable (WE#) pin 130.

The erase latch 176*a* is coupled to the erase circuitry 190 via the signal line 178*a*. The erase suspend latch 176*b* is coupled to the erase suspend circuitry 192 of the erase circuitry 190 via the signal line 178*b*.

The program latch 176*d* is coupled to the program circuitry 194 via the signal line 178*d*. The program suspend latch 176*e* is coupled to the program suspend circuitry 195 of the program circuitry 194 via the signal line 178*e*.

The read latch 176*m* is coupled to the read circuitry 196 via signal line 178*m*, and the read status latch 176*n* is coupled to the read status circuitry 198 via signal line 178*n*. The read status circuitry 198 is coupled to status register 142, which is coupled to provide status output to the data I/O and RY/BY# pins.

The memory array control circuitry 140 is coupled to provide one or more command reset signals 148 to the command decoder 170 for clearing the command latches 176*a–n*. The command decoder uses the command reset signals 148 to clear the command latches 176*a–n* via command latch reset signals 174*a–n*. For one embodiment, there are individual command latch reset signals coupled to each command latch 176*a–n*, so that each command latch 176*a–n* can be cleared independently. For another embodiment, one command latch reset signal is coupled to all of the command latches.

When a program suspend command is written to the command decoder, the command decoder provides a program suspend command to the program suspend latch 176*e*. When a program resume command is written to the command decoder, the command decoder 170 clears the program suspend latch 176*e* by asserting the command latch reset signal 174*e*.

For one embodiment, the program suspend command and the program resume command are the same command, but are distinguished from each other based on when they occur. Each time the program suspend/program resume command is written to the command decoder, the command decoder toggles between providing a program suspend command to the program suspend latch 176*e* or clearing the program suspend latch 176*e*.

For another embodiment, a single suspend command is used for both program suspends and erase suspends. A program suspend command and an erase suspend command are distinguished from each other based on when they occur. If an erase operation is being performed when the suspend command is written to the command decoder, then an erase suspend will be performed. If a program operation is being performed when the suspend command is written to the command decoder, then a program suspend will be performed. Furthermore, the program resume and the erase resume commands can be the same as the program suspend/erase suspend commands. The command decoder 170 keeps track of the last operation that was suspended. When the "suspend-resume" command is written to the command decoder while idle or a non-suspendable operation is being performed, then the last operation that was suspended is resumed.

The memory array control circuitry 140 interprets the command signals 178*a–n* provided to it and performs a corresponding operation in response to the command signals. The memory array control circuitry 140 includes program suspend circuitry 195 for suspending a program operation of the memory array 150. The memory array control circuitry 140 also includes erase suspend circuitry 192 for suspending an erase operation of the memory array 150. The memory array control circuitry 140 includes a means for storing the state of the suspended non-read operation so that the non-read operation can be resumed later. Non-read operations include program operations and erase operations in the following discussion. For an alternate embodiment, however, other types of operations, such as command operations and status retrieving operations, can be suspended.

A program suspend operation completes its suspend of a program operation within a predetermined amount of time to allow a read operation to be performed with a specified latency. The program suspend operation is initiated by writing a program suspend command to the command decoder 170. For one embodiment, the program suspend completes within 5 microseconds. After this predetermined amount of time, other operations can be performed on the flash device.

Similarly, the erase suspend operation completes within a predetermined amount of time. The erase suspend operation may be initiated by writing an erase suspend command to the command decoder 170. For one embodiment, suspending the erase operation completes within 20 microseconds. After this predetermined amount of time, other operations can be performed.

For one embodiment, it is possible to determine whether a program operation or an erase operation is being performed by accessing the status of the flash device using the read status command. Status can also be determined by the RY/BY# pin 162, as described previously. Alternatively, a separate pin can be used to provide an indication of whether a program operation or whether an erase operation is being performed.

FIG. 7 shows a block diagram of another embodiment of the command register 120 and the memory array control circuitry 140. The command register 120 of FIG. 7 is similar to that of FIG. 6, except that the command decoder of FIG. 7 includes erase resume latch 176c and program resume latch 176e.

The erase resume latch 176c receives a decoded command signal from command decoder 170 via signal line 172c. The erase resume latch 176c is latched upon assertion of the WE# pin 130. The erase resume latch 176c is coupled via signal line 178c to the erase suspend circuitry 192 of the erase circuitry 190. A command latch reset signal 174c is provided from the command decoder 170 to the erase resume latch 176c.

The program resume latch 176f receives a decoded command signal from command decoder 170 via signal line 172f The program resume latch 176f is latched upon assertion of the WE# pin 130. The program resume latch 176f is coupled via signal line 178f to the program suspend circuitry 195 of the program circuitry 194. A command latch reset signal 174f is provided from the command decoder 170 to the program resume latch 176f.

The program suspend latch 176e provides a signal to the program suspend circuitry 195 in order to suspend a program operation, and the program resume latch 176f provides a signal to the program suspend circuitry 195 in order to resume the suspended program operation.

In the foregoing specification, the invention has been described with reference to specific exemplary embodiments thereof. It will, however be evident to someone having the benefit of this disclosure, that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method of reading code from a nonvolatile writeable memory having at least a read mode and a write mode of operation, comprising:
    (a) disabling interrupts;
    (b) initiating a non-read operation in the memory, wherein the memory is operated in the write mode and, wherein, the non-read operation is initiated by low-level routines downloaded to a volatile memory from the memory; and
    (c) checking for interrupts, and in response to detecting an interrupt performing:
        (i) suspending the non-read operation, wherein the memory is operated in the read mode;
        (ii) enabling interrupts; and
        (iii) reading code from the memory.

2. The method of claim 1, wherein disabling interrupts further comprises disabling task switches and enabling interrupts further comprises enabling task switches.

3. The method of claim 1 wherein initiating a non-read operation is performed by initiating a non-read operation in a flash memory.

4. The method of claim 1, wherein disabling interrupts is performed by writing to a register within a processor to disable the processor from automatically handling an interrupt when it occurs.

5. The method of claim 1, wherein initiating a non-read operation in the nonvolatile writeable memory is initiated within a data section of the nonvolatile writeable memory.

6. A system comprising:
    a processor;
    a nonvolatile writeable memory having an array, the nonvolatile writeable memory having a first mode for allowing the array to be written to, and a second mode for allowing the array to be read from, the nonvolatile writeable memory storing low level code which when executed by the processor cause the processor to perform:
        (a) disabling interrupts;
        (b) initiating a non-read operation to the nonvolatile writeable memory while the array is in the first mode and, wherein, the non-read operation is initiated by low-level routines downloaded to a volatile memory from the nonvolatile writeable memory;
        (c) checking for interrupts, and in response to detecting an interrupt performing:
            (i) suspending the non-read operation;
            (ii) placing the array in the second mode;
            (iii) enabling interrupts; and
            (iv) reading code from the nonvolatile writeable memory.

7. The system of claim 6 wherein the entire array alternates from being in the first mode to being in the second mode.

8. The system of claim 6 further comprising a second memory that actually stores a copy of the low level code of the nonvolatile writeable memory.

9. The system of claim 6 wherein initiating a non-read operation is performed by initiating a program operation.

10. The system of claim 6 wherein the low level code, when executed by the processor, causes the processor to further perform, in response to detecting the interrupt:
    (v) executing the code read during the step (iv).

11. A computer-readable medium having stored thereon a plurality of instructions which, when executed by a processor, cause the processor to perform:
    (a) disabling interrupts;
    (b) initiating a non-read operation to the nonvolatile writeable memory while the array is in a first mode and, wherein, the non-read operation is initiated by low-level routines downloaded to a volatile memory from the nonvolatile writeable memory;
    (c) checking for interrupts, and in response to detecting an interrupt performing the steps of:
        (i) suspending the non-read operation;
        (ii) placing the array in a second mode;
        (iii) enabling interrupts; and
        (iv) reading code from the nonvolatile writeable memory.

12. The computer-readable medium of claim 11, wherein said plurality of instructions, when executed by a processor, cause said processor to perform:

(d) disabling task switching concurrent with at least a portion of (a) to (c).

13. A method of reading code from a first nonvolatile writeable memory block while managing data in a second block nonvolatile writeable memory block, the method comprising:
   (a) disabling interrupts;
   (b) initiating a non-read operation in the second nonvolatile writeable memory block, wherein the second nonvolatile writeable memory is operated in a write mode and, wherein, the non-read operation is initiated by low-level routines downloaded to a volatile memory block from the nonvolatile writeable memory block; and
   (c) checking for interrupts, and in response to detecting an interrupt performing:
      (i) suspending the non-read operation, wherein the second nonvolatile writeable memory is operated in a read mode;
      (ii) enabling interrupts; and
      (iii) reading code from the first nonvolatile writeable memory block.

* * * * *